United States Patent [19]

Cooperman et al.

[11] Patent Number: 5,361,006
[45] Date of Patent: Nov. 1, 1994

[54] ELECTRICAL CIRCUITRY WITH THRESHOLD CONTROL

[75] Inventors: Michael Cooperman, Framingham; Richard Sieber, Attleboro, both of Mass.

[73] Assignee: GTE Laboratories Incorporated, Waltham, Mass.

[21] Appl. No.: 35,138

[22] Filed: Mar. 19, 1993

[51] Int. Cl.$^5$ .............. H03K 19/0175; H03K 19/0948
[52] U.S. Cl. ........................................ 326/73; 326/21; 326/122; 327/513; 327/543
[58] Field of Search ............ 307/475, 451, 310, 296.8, 307/443, 246

[56] References Cited

U.S. PATENT DOCUMENTS

| | | | |
|---|---|---|---|
| 3,975,649 | 8/1976 | Kawagoe et al. | 307/296.8 |
| 4,384,287 | 5/1983 | Sakuma | 307/451 |
| 4,727,266 | 2/1988 | Fujii et al. | 307/451 |
| 4,763,021 | 8/1988 | Stickel | 307/443 |
| 4,808,852 | 2/1989 | Kousaka et al. | 307/451 |
| 5,001,481 | 3/1991 | Lee | 307/296.8 |
| 5,045,730 | 9/1991 | Cooperman et al. | 307/475 |
| 5,229,659 | 7/1993 | Sandhu | 307/451 |

Primary Examiner—Edward P. Westin
Assistant Examiner—Jon Santamauro
Attorney, Agent, or Firm—Victor F. Lohmann, III

[57] ABSTRACT

Electrical circuitry of CMOS inverter circuits in cascade providing a compatible interface between ECL logic levels and CMOS logic levels. The ECL input is applied to the gate of the N-type transistor of the first inverter circuit. A threshold control circuit includes a CMOS inverter circuit with the gate of the N-type transistor connected to a reference voltage and the gate of the P-type transistor connected to its drain is connected to the gate of the P-type transistor of the first inverter circuit. The threshold control circuit adjusts the threshold voltage of the first inverter circuit so as to compensate for changes in current flow through the N-type or P-type transistors, thereby permitting operation over extreme variations in circuit parameters under situations of poor operating tolerances and wide temperature variations.

9 Claims, 6 Drawing Sheets

ELECTRICAL CIRCUITRY WITH THRESHOLD CONTROL

REFERENCE TO RELATED APPLICATION

This application contains subject matter which is related to subject matter disclosed and claimed in applications Ser. No. (08/035,127) entitled "Logic Circuitry" and Ser. No. (8/036,132) entitled "Electrical Circuitry" filed concurrently herewith and assigned to the assignee of the present application. These applications are hereby incorporated by reference into the present application.

BACKGROUND OF THE INVENTION

This invention relates to electrical circuitry. More particularly, it is concerned with logic circuits which provide an interface between. two logic systems.

Two widely-used, well-known logic systems are ECL (emitter coupled logic) and CMOS (complementary metal oxide semiconductor) logic systems. The logic levels for ECL logic are −1.6 volts and −0.8 volt and for CMOS the logic levels are 0 volts and +5 volts. The threshold voltage for CMOS logic, that is the voltage at which a CMOS logic circuit triggers from one operating state to another, is +2.5 volts. Since this voltage is outside the operating range of ECL logic, CMOS logic circuitry is not directly compatible with ECL circuitry. CMOS logic circuits may be made compatible 25 with input from ECL circuitry by changing the operating voltages of the CMOS circuitry to −3.7 volts and +1.3 volts to provide a threshold voltage of −1.2 volts, the threshold voltage of ECL circuitry. Under operating conditions, however, variations in temperature or circuit parameters may cause changes in the current flow through the transistors thereby altering the threshold voltage of the circuit. Since the operating range of ECL logic is relatively narrow, even small changes can cause the circuit to become inoperable.

SUMMARY OF THE INVENTION

Electrical circuitry in accordance with the present invention includes inverter circuit means comprising a complementary pair of MOS transistors connected in series between a first voltage source and a second voltage source. An input connection is connected to the gate of one of the MOS transistors, and a control connection is connected to the gate of the other MOS transistor. The circuitry includes control means coupled to the control connection for producing a control signal which controls the current flow through the other of the MOS transistors. The inverter circuit means is operable to produce a first output signal at its output in response to a first voltage condition at the input connection causing the current flow through the one of the MOS transistors to be greater than the current flow through the other of the MOS transistors; and the inverter circuit means is operable to produce a second output signal at its output in response to a second voltage condition at the input connection causing the current flow through the one of the MOS transistors to be less than the current flow through the other of the MOS transistors. The control means is operable when current flow through the one of tile MOS transistors changes to produce a control signal which changes current flow through the other of the MOS transistors so that current flow through the other of the MOS transistors is less than the current flow through the one of the MOS transistors when the first voltage condition is present at the input connection and is greater than the current flow through the one of the MOS transistors when the second voltage condition is present at the input connection.

Electrical circuitry in accordance with a more specific aspect of the present invention includes inverter circuit means comprising a complementary pair of MOS inverter transistors connected in series between a first voltage source and a second voltage source. One of MOS inverter transistors is N-type and the other of the MOS transistors is P-type. An input connection is connected to the gate of the N-type inverter transistor, and a control connection is connected to the gate of the P-type inverter transistor. The circuitry includes control means connected to the control connection and comprising a complementary pair of MOS control transistors connected in series between a first voltage source and a second voltage source. One of the MOS transistors of the complementary pair is N-Type and the other of the MOS transistors is P-type. A source of reference voltage is connected to the gate of the N-type control transistor. The gate of the P-type control transistor is connected to the juncture of the P-type control transistor and the N-type control transistor. The juncture of the P-type control transistor and the N-type control transistor is connected to the control connection whereby a control signal produced by the control means is applied to the gate of the P-type inverter transistor. The inverter circuit means is operable to produce a relatively low level output signal at its output in response to an input voltage at said input connection which is relatively high with respect to said reference voltage causing the current flow through the N-type inverter transistor to be greater than the current flow through the P-type inverter transistor. The inverter circuit means is also operable to produce a relatively high level output signal at its output in response to an input voltage at the input connection which is relatively low with respect to the reference voltage causing the current flow through the N-type inverter transistor to be less than the current flow through the P-type inverter transistor. The control means is operable when the currents flowing through the N-type transistors change to produce a control signal changing current flow through the P-type inverter transistor so that current flow through the P-type inverter transistor is less than the current flow through the N-type inverter transistor when a relatively high input voltage is present at the input connection and is greater than the current flow through the N-type inverter transistor when a relatively low input voltage is present at the input connection.

In accordance with another aspect of the invention a speed-up capacitance means is connected between the gate of the N-type inverter transistor and the gate of the P-type inverter transistor.

For a better understanding of the present invention, together with other and further objects, advantages, and capabilities thereof, reference is made to the following disclosure and appended claims in connection with the above-described drawings.

DETAILED DESCRIPTION

Figure 1:
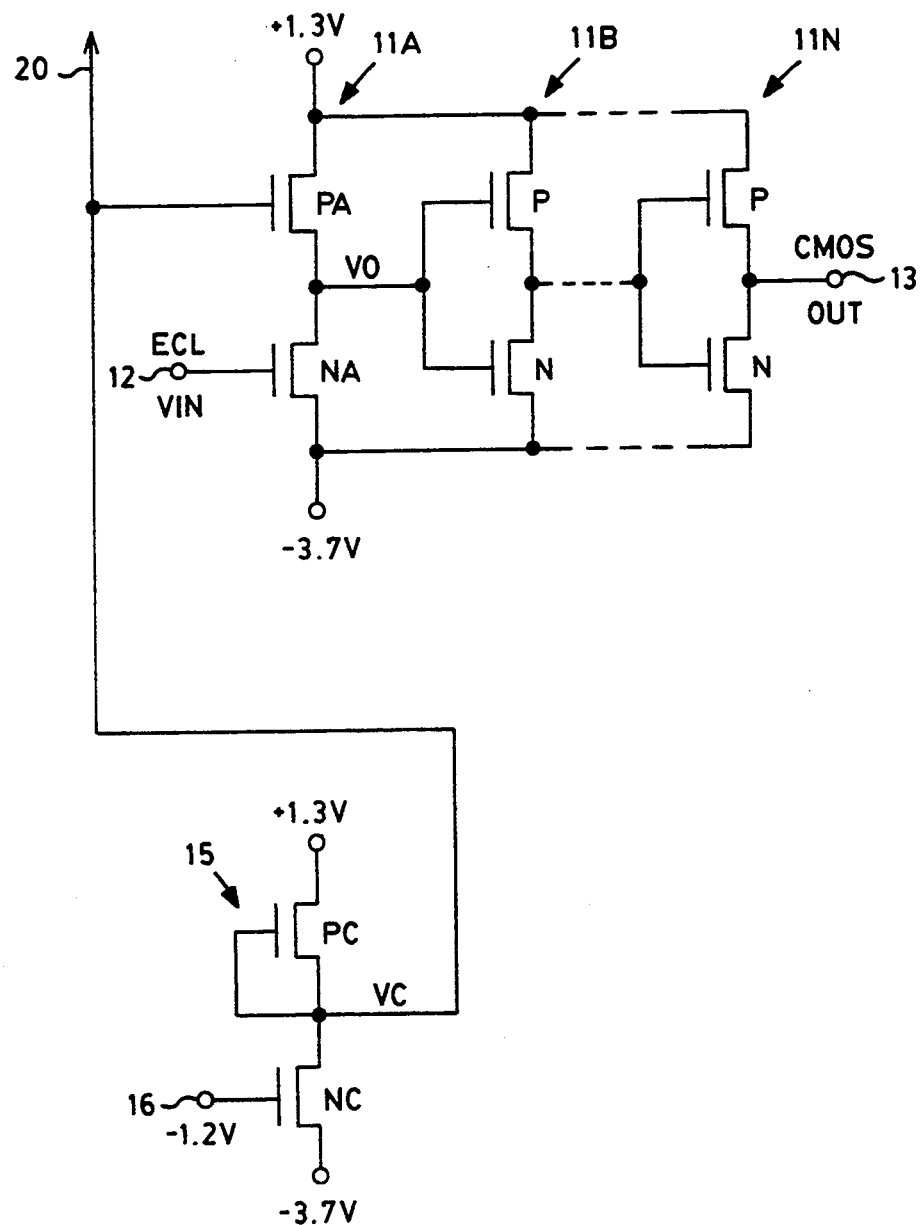
FIG. 1 is a schematic circuit diagram of electrical circuitry in accordance with the present invention.

FIG. 1 is a circuit diagram illustrating a series of CMOS inverter circuits with the output of each stage connected to the input of the subsequent stage as is well known. Such an arrangement may be utilized in various types of CMOS circuitry as, for example, in a cross-point switching array as described in U.S. Pat. No. 4,818,988 to Cooperman and Sieber. The circuits are CMOS inverter circuits and are designed to operate with 5 volt CMOS input levels. These circuits may be adapted to operate with 800 millivolt ECL input levels by employing supply voltages of +1.3 volts and −3.7 volts as shown in FIG. 1.

A series of CMOS inverter circuits 11A, 11B, 11N is illustrated in FIG. 1. Each inverter circuit has a P-type MOS transistor and an N-type MOS transistor connected in series between the voltage sources of +1.3 volts and −3.7 volts to provide compatibility to serve as an ECL to CMOS converter circuit. ECL input signals are applied to an input terminal 12 which is connected only to the gate of the N-type transistor NA of the first inverter circuit 11A. The gate of the P-type transistor PA of the first inverter circuit 11A is connected to a threshold control circuit 15. In the conventional manner the gates of the transistors of each of the other inverter circuits 11B through 11N are connected together to provide an input and the juncture between them provides an output.

As is well understood in the operation of CMOS inverter circuits of the prior art, when the voltage at the input of an inverter circuit is above the threshold voltage, which is typically midway between the supply voltages, the P-type transistor is nonconducting and the N-type transistor is conducting producing a voltage at the output which is relatively low. When the voltage at the input is below the threshold voltage, the P-type transistor is conducting and the N-type transistor is nonconducting, producing a voltage at the output which is relatively high.

The threshold voltage of the first inverter circuit 11A of the circuit in accordance with the present invention is controlled by the threshold control circuit 15 altering operation of the first inverter circuit 11A. As will be discussed in greater detail hereinbelow, when the voltage at the input 12 is above the threshold voltage, current flow through the N-type transistor NA is greater that that through the P-type transistor PA and the voltage at the output VO is relatively low. When the voltage at the input 12 is below the threshold voltage, current flow through the N-type transistor NA is less than that through the P-type transistor PA and the voltage at the output VO is relatively high.

By virtue of the operating voltages of +1.3 volts and −3.7 volts, the circuit of FIG. 1 is adapted to receive ECL logic input signals of −1.6 volts and −0.8 volt, with a midpoint or threshold voltage of −1.2 volts, at the input 12. Because of the relatively narrow ECL input range of 800 millivolts, the output of the first inverter stage 11A is of the order of 3 volts rather than the full 5 volts of usual CMOS operation, as explained in U.S. Pat. No. 5,045,730 to Cooperman and Sieber. The operation of the second inverter circuit 11B in the series produces a full 5 volt range at its output.

The threshold control input at the gate of the P-type transistor PA of the first inverter circuit 11A controls the input threshold of the circuit. The threshold control circuit 15 produces the threshold control voltage VC at the gate of the transistor PA. The threshold control circuit 15 includes a complementary pair of transistors PC and NC connected in series between voltage sources of +1.3 volts and −3.7 volts. The gate of the P-type transistor PC is connected to the juncture between the transistors PC and NC of the complementary pair. The gate of the N-type transistor NC is connected to a reference voltage of −1.2 volts, the threshold voltage of ECL logic circuitry. The output of the threshold control circuit 15 is taken at the juncture of the complementary pair of transistors and is labeled VC.

In accordance with the teachings in application Ser. No. 08/035,127 filed concurrently herewith, transistors NA and PA of the first inverter circuit 11A may be made larger than the transistors of the same type in the remaining inverter circuits 11B, 11N of the series in order to improve switching speed. Specifically, the width of the channel of transistor PA is three times-the width of the channels of the P-type transistors in the subsequent inverter circuits 11B, 11N; and the width of the channel of transistor NA is three times the width of the channels of the N-type transistors in the subsequent inverter circuits 11B, 11N. In order for optimum operation of the circuit of FIG. 1 as will be discussed hereinbelow, transistor PC should be physically identically the same as transistor PA and transistor NC should be physically identically the same as transistor NA.

Figure 2:
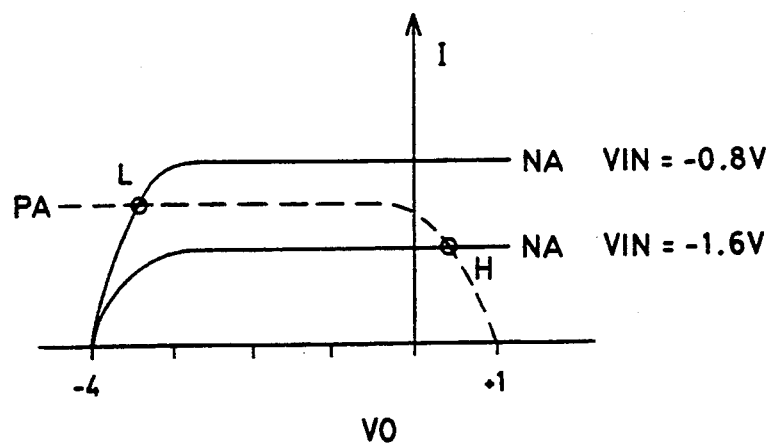
FIGS. 2 and 3 are current-voltage curves illustrating operation of prior art circuitry under normal and adverse conditions, respectively.

FIG. 2 illustrates normal operation of the transistors PA and NA of the first inverter circuit 11A if the threshold voltage applied to the gate of transistor PA is fixed at −1.2 volts and the threshold control circuit 15 is not connected. Under these conditions the current flow through transistor PA is fixed as shown by the dashed line PA. Current flow through transistor NA is greater than that through transistor PA when the input voltage VIN is −0.8 volts, and is less than that through transistor PA when the input voltage VIN is −1.6 volts. As can be seen from FIG. 2, with an input voltage VIN of −0.8 volts operating curves of the transistors PA and NA intersect at point L producing a relatively low output signal. With an input voltage VIN of −1.6 volts the operating curves intersect at point H producing a relatively high output voltage.

Figure 3:
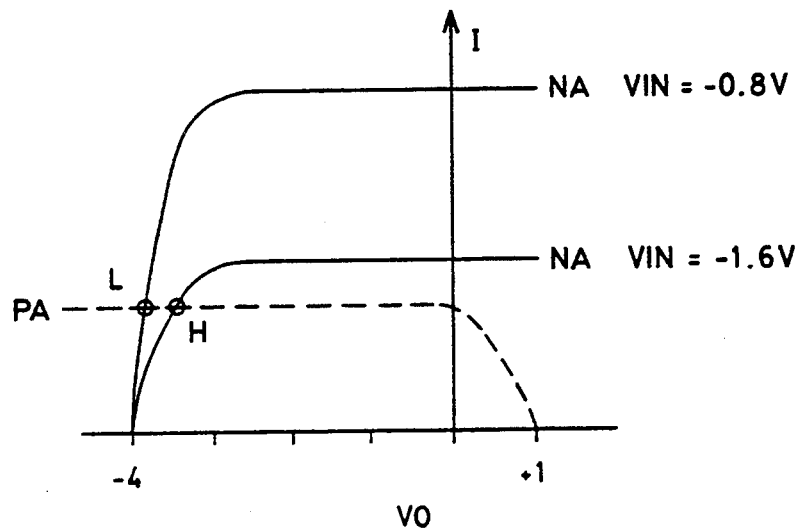

FIG. 3 illustrates the situation with the threshold voltage fixed at −1.2 volts and the threshold control circuit 15 not connected as in FIG. 2 when changes in ambient conditions cause the current flow through the N-type transistor NA to become twice the normal current which was illustrated by FIG. 2. By virtue of the −1.2 volts applied to its gate, current flow through transistor PA remains the same as illustrated by the dashed line PA in FIG. 3. Current flow through N-type transistor NA, however, is greater than current flow through transistor PA when the input voltage VIN is −0.8 volt and also when the input voltage VIN is −1.6 volts. The operating curves with these input levels intersect with that of transistor PA at points L and H. As can be seen from FIG. 3, this situation renders the circuit inoperative.

Figure 4A:
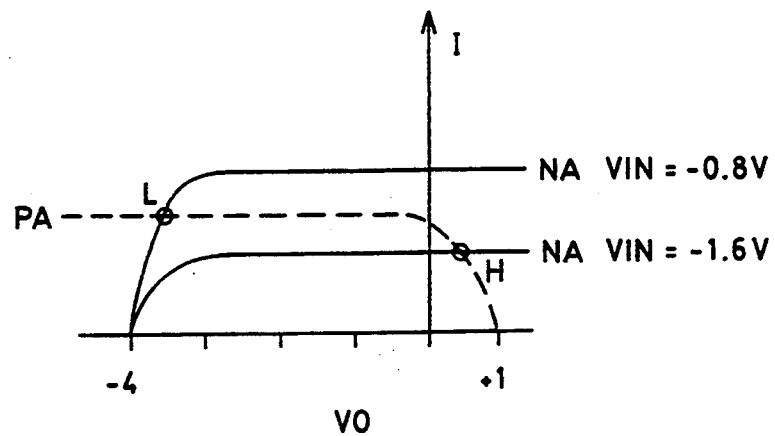
FIG. 4A is a current-voltage curve illustrating operation of circuitry in accordance with the present invention under normal conditions.

FIG. 4A illustrates the operation of the first inverter circuit 11A with the threshold control circuit 15 connected to provide a threshold control voltage VC to the gate of the P-type transistor PA. Under normal operating conditions the threshold voltage VC applied to the gate of the P-type transistor PA is −1.2 volts and the circuit operates in a normal manner as discussed previously with regard to FIG. 2. (FIG. 4A is identical to FIG. 2.)

Figure 4B:
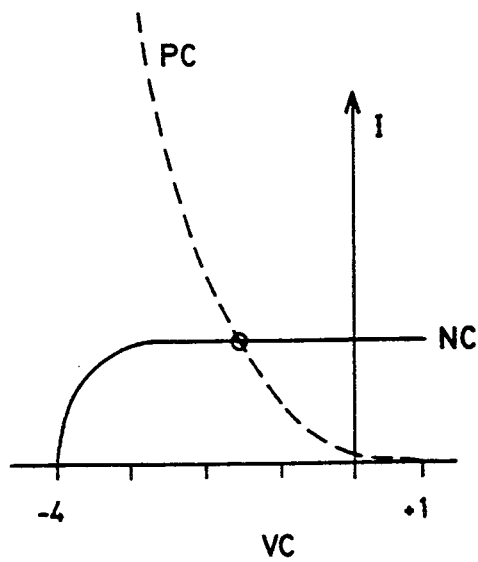
FIG. 4B is a current-voltage curve illustrating the operation of a portion of the circuit in accordance with the present invention under normal conditions.
Figure 6:
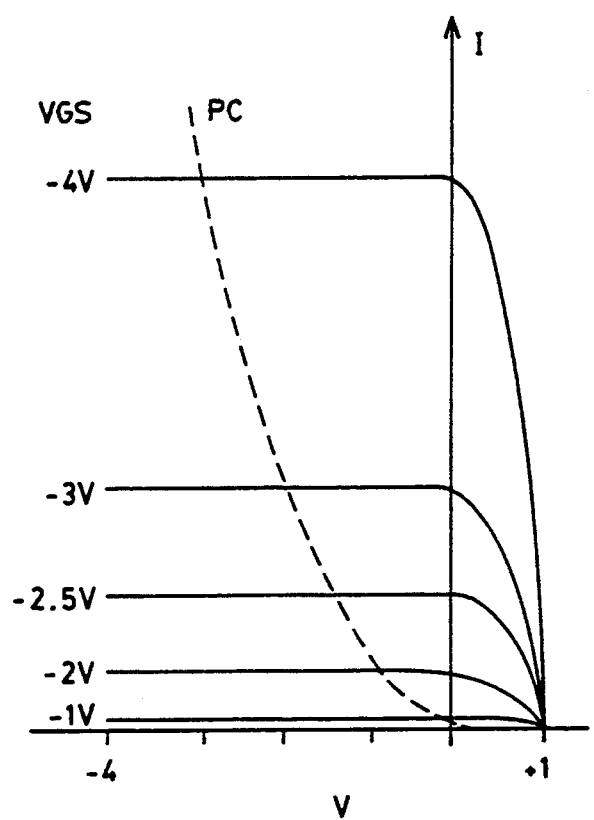
FIG. 6 is a current-voltage characteristic curve of one of the devices of the circuit in accordance with the present invention.

FIG. 4B illustrates the voltage-current curves of the transistors PC and NC of the threshold control circuit 15 under the same normal operating conditions. The current through the N-type transistor NC is determined, as illustrated by the solid line NC, by the −1.2 volts reference voltage applied at the terminal 16 to the gate of transistor NC. Transistor PC has the operating curve as illustrated by the dashed line PC in FIG. 4B. This curve is obtained from the current-voltage characteristics of a P-type MOS transistor as shown in FIG. 6 by shorting the gate to the drain. Under normal conditions as illustrated by FIG. 4B the threshold control circuit 15 produces a threshold control voltage VC of approximately −1.2 volts. Current flow through transistor PA is thus approximately midway between current flow through transistor NA when the input signal VIN is −0.8 volt and −1.6 volts thus producing the two operating points L and H, respectively. (FIG. 4A)

Figure 5A:
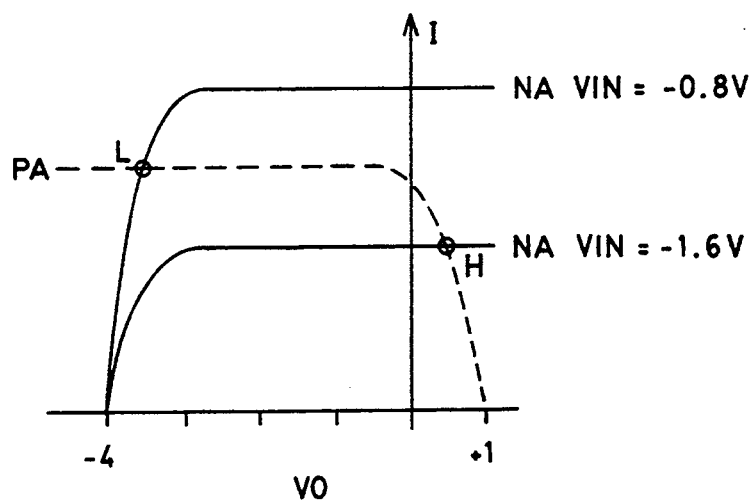
FIG. 5A is a current-voltage curve illustrating operation of electrical circuitry in accordance with the present invention under adverse conditions.
Figure 5B:
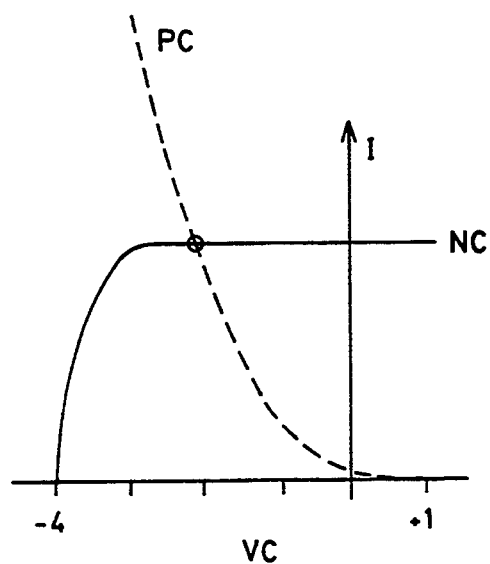
FIG. 5B is a current-voltage curve illustrating the operation of a portion of the circuit in accordance with the present invention under adverse conditions.

The following is a discussion of the operation of the circuitry of FIG. 1 when changes in ambient conditions cause current flow through the N-type transistors to become twice the normal currents; the same situation discussed hereinabove with respect to FIG. 3. All the circuitry elements of FIG. 1 are physically located in close proximity as in a single chip so that all devices are subject to the same ambient conditions and are similarly affected by external factors. Curves NA of FIG. 5A illustrate the doubling of current flow through transistor NA when the input voltage VIN is −0.8 volt and −1.6 volts. As illustrated in FIG. 5B the current flow through transistor NC of the threshold control circuit 15 also doubles. The intersection of the operating curve of transistor NC with that of the P-type transistor PC shifts to produce a lower value of threshold control voltage VC. As illustrated by FIGS. 4B and 5B the threshold control voltage VC shifts from about −1.2 volts to about −2.2 volts. The threshold control voltage VC of −2.2 volts is applied to the input at the gate of the P-type transistor PA in the first inverter circuit 11A. As illustrated by the dashed line PA of FIG. 5A, current flow through transistor PA increases so that its current flow is approximately midway between current flow in transistor NA when the input levels are either −0.8 volt or −1.6 volts. Thus, as can be seen by the intersections of the current-voltage curves for transistors PA and NA in FIG. 5A, the low and high operating points L and H are such that the circuit continues to operate effectively. Thus, electrical circuitry in accordance with the invention as illustrated by FIG. 1 provides an ECL to CMOS converter which operates over extreme variations in circuit parameters under situations of poor operating tolerances and wide temperature variations. The threshold control circuit 15 may be utilized to provide a threshold control voltage VC to all circuits on the same chip or within the same integrated circuit as indicated by the arrow 20.

Figure 7:
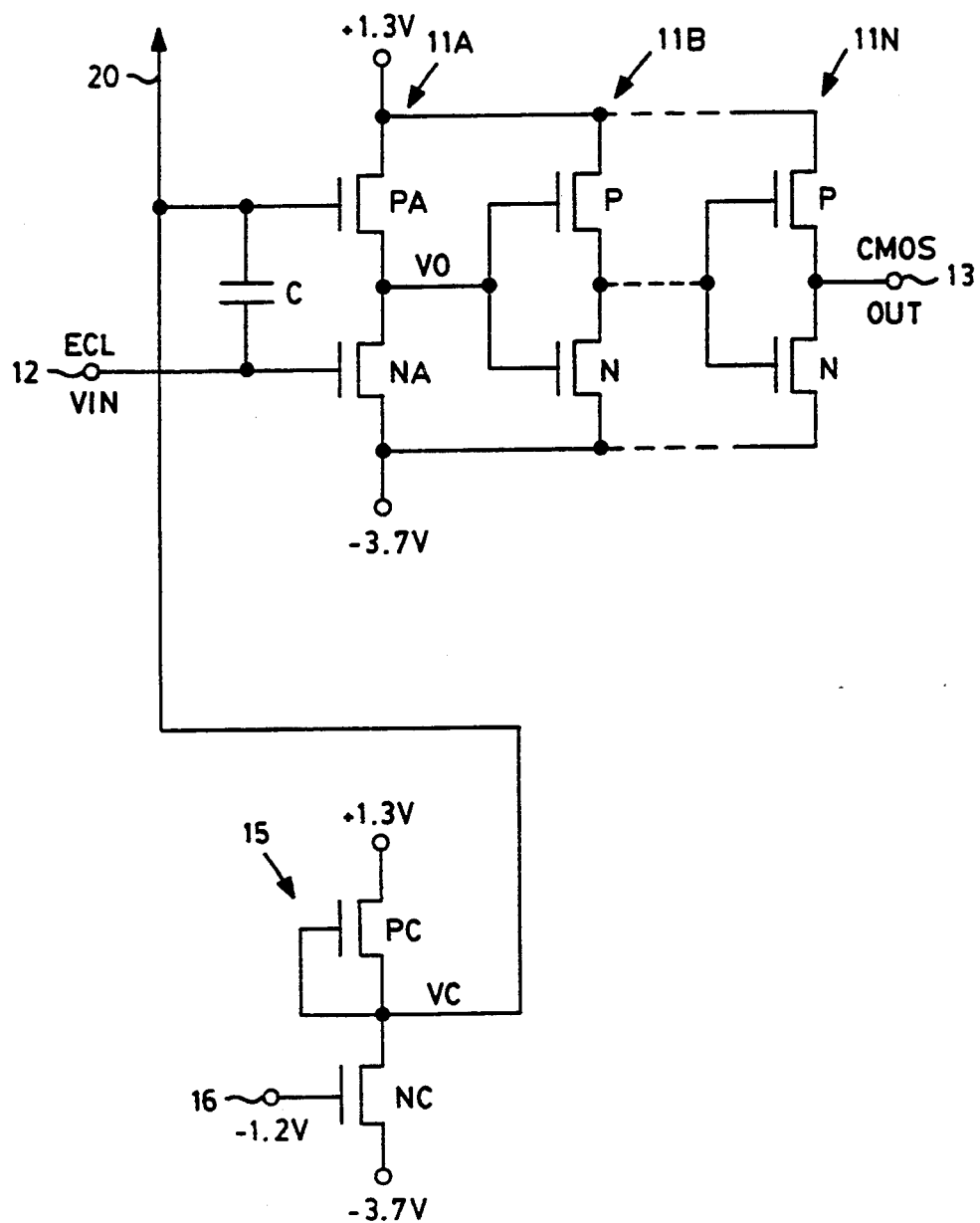
FIG. 7 is a schematic circuit diagram illustrating a modification of electrical circuitry in accordance with the present invention.

FIG. 7 illustrates a modification of the circuitry of FIG. 1. The circuit is the same except for the addition of a speed-up capacitance C connected between the gate of the N-type transistor NA and the gate of the P-type transistor PA. Upon a change in the ECL input signal VIN at the input connection 12, the presence of the capacitance C causes the voltage at the gate of transistor PA to change in the direction toward the new signal level. This action causes transistor PA to help transistor NA in moving the output VO to the new logical value thereby speeding-up the switching action of the inverter.

When the circuit structure is fabricated in standard 1.2 micrometer CMOS technology without the speed-up capacitance (FIG. 1), the circuit operates at about 600 megabits per second. The circuit with the addition of the speed-up capacitance C (FIG. 7) of approximately 0.5 picofarads operates in excess of a gigabit per second.

While there has been shown and described what is considered a preferred embodiment of the present invention, it will be obvious to those skilled in the art that various changes and modifications may be made therein without departing from the invention as defined by the appended claims.

What is claimed is:

1. Electrical circuitry including
inverter circuit means comprising
a complementary pair of MOS transistors connected in series between a first voltage source and a second voltage source,
an input connection connected to the gate of one of said MOS transistors,
a control connection connected to the gate of the other of said MOS transistors; and
control means coupled to said control connection for producing a control signal controlling the current flow through said other of the MOS transistors;
said inverter circuit means being operable to produce a first output signal at its output in response to a first voltage condition at said input connection causing the current flow through said one of the MOS transistors to be greater than the current flow through said other of the MOS transistors, and being operable to produce a second output signal at its output in response to a second voltage condition at said input connection causing the current flow through said one of the MOS transistors to be less than the current flow through said other of the MOS transistors; and
said control means being operable when current flow through said one of the MOS transistors changes to produce a control signal changing current flow through said other of the MOS transistors so that current flow through said other of the MOS transistors is less than the current flow through said one of the MOS transistors when said first voltage condition is present at said input connection, and is greater than the current flow through said one of the MOS transistor when said second voltage condition is present at said input connection; wherein said one of the MOS transistors is N-type; and
said other of the MOS transistors is P-type; and including
speed-up capacitance means connected between the gate of the N-type transistor and the gate of the P-type transistor.

2. Electrical circuitry in accordance with claim 1 including
a second inverter circuit means comprising a complementary pair of MOS transistors connected in series between the first voltage source and the second voltage source, one of said MOS transistors being N-type and the other of said MOS transistors being P-type;
the gates of the MOS transistors of the second inverter circuit means being connected to the juncture of the MOS transistors of the first-mentioned inverter circuit means.

3. Electrical circuitry in accordance with claim 2 wherein
said N-type MOS transistor and said P-type MOS transistor of the first-mentioned inverter circuit means are larger than the transistors of the same type in the second inverter circuit means.

4. Electrical circuitry including
inverter circuit means comprising
a complementary pair of MOS inverter transistors connected in series between a first voltage source and a second voltage source, one of said MOS inverter transistors being N-type and the other of said MOS inverter transistors being P-type,
an input connection connected to the gate of the N-type inverter transistor, and
a control connection connected to the gate of the P-type inverter transistor;
control means connected to said control connection comprising
a complementary pair of MOS control transistors connected in series between a first voltage source and a second voltage source, one of said MOS transistors being N-type and the other of said MOS transistors being P-type,
a source of reference voltage connected to the gate of the N-type control transistor,
the gate of the P-type control transistor being connected to the juncture of the P-type control transistor and the N-type control transistor,
the juncture of the P-type control transistor and the N-type control transistor being connected to the control connection whereby a control signal produced by the control means is applied to the gate of the P-type inverter transistor;
said inverter circuit means being operable to produce a relatively low level output signal at its output in response to an input voltage at said input connection which is relatively high with respect to said reference voltage causing the current flow through said N-type inverter transistor to be greater than the current flow through said P-type inverter transistor;
said inverter circuit means being operable to produce a relatively high level output signal at its output in response to an input voltage at said input connection which is relatively low with respect to said reference voltage causing the current flow through said N-type inverter transistor to be less than the current flow through said P-type inverter transistor; and
said control means being operable when the currents flowing through said N-type transistors change to produce a control signal changing current flow through said P-type inverter transistor so that the current flow through said P-type inverter transistor is less than the current flow through the N-type inverter transistor when the relatively high input voltage is present at said input connection, and is greater than the current flow through said N-type inverter transistor when the relatively low input voltage is present at said input connection; and including speed-up capacitance means connected between the gate of the N-type inverter transistor and the gate of the P-type inverter transistor.

5. Electrical circuitry in accordance with claim 4 including
a second inverter circuit means comprising a complementary pair of MOS transistors connected in series between the first voltage source and the second voltage source, one of said MOS transistors being N-type and the other of said MOS transistors being P-type;
the gates of the MOS transistors of the second inverter circuit means being connected solely to the juncture of the MOS inverter transistors of the first-mentioned inverter circuit means.

6. Electrical circuitry in accordance with claim 5 wherein
said N-type MOS transistors and said P-type MOS transistors of the first-mentioned inverter circuit means and of the control means are larger than the transistors of the same type in the second inverter circuit means.

7. Electrical circuitry in accordance with claim 6 wherein
said inverter transistors and said control transistors are physically located so that external factors affecting their voltage-current characteristics have approximately the same effect on the inverter transistors and the control transistors.

8. Electrical circuitry in accordance with claim 7 wherein
said reference voltage is midway between the relatively high input voltage and the relatively low input voltage applied at the input connection.

9. Electrical circuitry in accordance with claim 8 wherein
said reference voltage is $-1.2$ volts, the relatively high input voltage applied at the input connection is $-0.8$ volt, and the relatively low input voltage applied at the input connection is $-1.6$ volts.

* * * * *